(12) United States Patent
Jeong

(10) Patent No.: US 7,817,425 B2
(45) Date of Patent: Oct. 19, 2010

(54) DISSIPATING APPARATUS FOR INTEGRATED CIRCUIT CHIP AND DISPLAY MODULE INCLUDING THE SAME

(75) Inventor: Kwang-Jin Jeong, Suwon-si (KR)

(73) Assignee: Samsung SDI Co., Ltd., Yongin-si, Gyeonggi-do (KR)

(*) Notice: Subject to any disclaimer, the term of this patent is extended or adjusted under 35 U.S.C. 154(b) by 617 days.

(21) Appl. No.: 11/387,428

(22) Filed: Mar. 22, 2006

(65) Prior Publication Data

US 2006/0215372 A1    Sep. 28, 2006

(30) Foreign Application Priority Data

Mar. 24, 2005 (KR) ............... 10-2005-0024566

(51) Int. Cl.
*H05K 7/20* (2006.01)
(52) U.S. Cl. .................. 361/704; 361/710; 361/719; 165/80.3; 257/712; 313/46
(58) Field of Classification Search ............. 361/704, 361/715, 719, 692, 702, 703, 707, 709, 710, 361/711; 313/582, 479, 489, 44; 438/166; 165/80.3, 185; 174/16.3; 257/706, 722, 257/E23.084, E23.103
See application file for complete search history.

(56) References Cited

U.S. PATENT DOCUMENTS

| | | | | |
|---|---|---|---|---|
| 4,356,864 A | * | 11/1982 | Ariga et al. | ............. 165/80.3 |
| 5,358,032 A | | 10/1994 | Arai et al. | |
| 5,499,450 A | * | 3/1996 | Jacoby | .............. 29/890.03 |
| 5,701,951 A | * | 12/1997 | Jean | ................. 165/121 |

(Continued)

FOREIGN PATENT DOCUMENTS

CN    1270303 A    10/2000

(Continued)

OTHER PUBLICATIONS

Notice of Submit Response by Korean Intellectual Property Office on Sep. 26, 2006.

(Continued)

*Primary Examiner*—Jayprakash N Gandhi
*Assistant Examiner*—Courtney Smith
(74) *Attorney, Agent, or Firm*—Knobbe Martens Olson & Bear, LLP

(57) ABSTRACT

A heat dissipating apparatus for an IC chip, having a structure capable of effectively dissipating heat created by an IC chip to the outside, and a display module including the same are disclosed. In one embodiment, the display module includes a panel that forms an image, a chassis disposed at the rear of the panel to support the panel, at least one IC chip that emits heat mounted on at least one circuit board installed at the rear of the chassis, and a heat dissipating apparatus that dissipates heat emitted by the IC chip to the outside. The heat dissipating apparatus is attached to contact the IC chip, and has a heat conducting chip contact plate, and a heat conducting heat discharging plate formed in one piece with a plurality of mutually proximal joining portions joined to the chip contact plate, and a plurality of heat dissipating portions bent to protrude outward from the joining portions to connect the joining portions.

17 Claims, 5 Drawing Sheets

U.S. PATENT DOCUMENTS

| | | | |
|---|---|---|---|
| 5,971,566 A * | 10/1999 | Tani et al. | 362/294 |
| 6,077,140 A * | 6/2000 | Kimura et al. | 445/24 |
| 6,230,789 B1 * | 5/2001 | Pei et al. | 165/80.3 |
| 6,244,332 B1 * | 6/2001 | Gesklin et al. | 165/80.3 |
| 6,357,514 B1 * | 3/2002 | Sasaki et al. | 165/80.3 |
| 6,414,433 B1 * | 7/2002 | Moore | 313/582 |
| 6,534,722 B2 * | 3/2003 | Takaoka | 174/254 |
| 6,744,186 B2 * | 6/2004 | Oishi et al. | 313/46 |
| 6,849,992 B2 * | 2/2005 | Kim et al. | 313/46 |
| 7,133,281 B2 * | 11/2006 | Bae | 361/681 |
| 7,167,365 B2 * | 1/2007 | Fu et al. | 361/697 |
| 7,182,124 B2 * | 2/2007 | Chen | 165/80.3 |
| 7,215,549 B2 * | 5/2007 | Kim | 361/704 |
| 7,265,984 B2 * | 9/2007 | Numata | 361/719 |
| 2004/0164679 A1 * | 8/2004 | Hibino et al. | 313/582 |
| 2005/0156013 A1 * | 7/2005 | Bhatti et al. | 228/193 |
| 2005/0259401 A1 * | 11/2005 | Han et al. | 361/704 |
| 2007/0046205 A1 * | 3/2007 | Kwon et al. | 313/582 |

FOREIGN PATENT DOCUMENTS

| | | |
|---|---|---|
| CN | 2523022 Y | 11/2002 |
| JP | 10-222076 | 8/1998 |
| JP | 2000-040799 | 2/2000 |
| JP | 2000-333190 | 11/2000 |
| JP | 2000-349212 | 12/2000 |
| JP | 2001-244396 | 9/2001 |
| JP | 2004-273937 | 9/2004 |
| KR | 20 1991-0009270 | 11/1991 |
| KR | 10 2003-0080726 | 10/2003 |

OTHER PUBLICATIONS

First Office Action for China Patent Application No. 200610067376.X dated Oct. 31, 2008.

Chinese Registration Determination Certificate of Patent for Invention Cert. No. 641506; Patent No. ZL200610067376.X, issued Jun. 16, 2010.

* cited by examiner

DISSIPATING APPARATUS FOR INTEGRATED CIRCUIT CHIP AND DISPLAY MODULE INCLUDING THE SAME

CROSS-REFERENCE TO RELATED PATENT APPLICATION

This application claims the benefit of Korean Patent Application No. 10-2005-0024566, filed on Mar. 24, 2005, in the Korean Intellectual Property Office, the disclosure of which is incorporated herein in its entirety by reference.

BACKGROUND OF THE INVENTION

1. Field of the Invention

The present invention relates to a heat dissipating apparatus of an integrated circuit (IC) chip and a display module including the same. More specifically, the invention relates to a heat dissipating apparatus having a structure capable of effectively dissipating heat created by an IC chip to the outside, and a display module including the same.

2. Description of the Related Technology

Plasma display modules are flat panel displays that use a discharge gas to display images. The technology enables the manufacture of thin-profile screens, and allows for the formation of large-scale, high resolution displays with a wide viewing angle, and has thus attracted much interest recently.

Such plasma display modules have mutually-facing flat panels with discharging cells disposed between the two panels. After a discharge gas is injected into the cell, the cell is sealed. Then, a voltage is applied to electrodes traversing the discharging cell, inducing a discharge of light from the gas in the discharging cell, and the discharge gas produces ultraviolet radiation, which excites phosphor to produce visible light, thus forming an image.

Here, the voltage applied to the electrodes is controlled in response to a video signal received from the outside. An IC chip on the circuit board for driving the plasma display module generally simultaneously controls a large quantity of video signals. Accordingly, the IC chip is subject to a heavy load, and therefore emits a considerable amount of heat.

An intelligent power module (IPM) can be used as the IC chip for a plasma display module. However, when an IPM is used, more heat is generated than in an ordinary IC chip, due to the IPM's integrated circuit.

Accordingly, plasma display modules use heat sinks 60 as shown in FIGS. 1 and 2, in order to dissipate heat generated by such IC chips to the outside. The heat sink 60 is usually attached using an adhesive to the rear of an IPM or other IC chip 55 disposed on a circuit board 51. In this case, the circuit board 51 is installed on a chassis 40. One example of such an installation structure includes a boss 47 formed on the chassis 40 opposite the circuit board 51, so that a screw 95 passes through a hole on the circuit board 51 to screw into the boss 47.

As shown in FIG. 2, the heat sink 60 includes a base 61 and a plurality of heat dissipating fins 65 extending from the base 61. The larger the surface area of the heat dissipating fins 65 is, the larger their heat dissipating capacity becomes. Air passages are formed between the heat dissipating fins 65. Accordingly, hot air radiated by the IC chip 55 is transmitted to the outside via the heat dissipating fins 65, rising upward along the air passages.

However, the heat sink 60 with such a structure cannot adequately dissipate the heat generated by the IC chip 55 to the outside. That is, taking the example of a 42 inch HD plasma display panel, an ordinary heat sink attached to an IPM has a respective width, length, and height of 7 cm, 10 cm, and 3 cm. In this case, if the IPM temperature is 65° C., heat of about 20 W is emitted from the IPM. However, the heat sink 60 with the dimensions above can only dissipate about 10 W of heat; and therefore, the remaining 10 W of heat is not dissipated to the outside.

The increase of the size of the heat sink 60 can be considered in order to increase the heat dissipating capacity of the heat sink 60, but it is not possible to increase its size because the structure of a plasma display module contains various elements in close proximity, whose space would be infringed by larger-sized heat sinks 60.

In order to overcome these problems, the installation of a cooling fan adjacent to the chip 55 for force-cooling the IC chip 55 can be considered. However, this entails the process of installation of cooling components other than the cooling fan to be installed on the chassis 40. Consequently, the manufacturing cost increases, and the plasma display module emits noise and vibration, due to the operation of the cooling fan.

SUMMARY OF CERTAIN INVENTIVE ASPECTS

One aspect of the present invention provides a heat dissipating apparatus for an IC chip with a structure capable of effectively dissipating heat emitted from an IC chip to the outside and a display module including the same.

Another aspect of the present invention provides a lighter and smaller heat dissipating apparatus for an IC chip and a display module including the same.

Another aspect of the present invention provides a heat dissipating apparatus for an IC chip that drives a panel which forms images, having a chip contact plate and a heat discharging plate for dissipating heat emitted by the IC chip to the outside.

In one embodiment, the heat contact plate may have a heat conductivity and may be attached to contact the IC chip. In one embodiment, the heat discharging plate may be formed as a single heat conducting plate and have a plurality of joining portions for joining to the heat contact plate, and a plurality of heat dissipating portions formed along one piece with the mutually proximal joining portions and bent to protrude outward from the ends of the joining portions to connect the joining portions.

In one embodiment, in the case where the heat discharging plate is formed of copper or aluminum, it may be press-formed.

In one embodiment, the chip contact plate may be formed of copper or aluminum.

In one embodiment, a plurality of holes may be formed on the heat discharging plate.

In one embodiment, a boss caulking or a fin swaging may be attached on the joining portion of the heat discharging plate and the chip contact plate.

In one embodiment, a heat conducting medium may be interposed between the IC chip and the chip contact plate.

In one embodiment, the IC chip may be an intelligent power module (IPM).

Another aspect of the present invention provides a display module including a panel, a chassis, at least one circuit board, and a heat dissipating apparatus. In one embodiment, an image may be formed through the panel. In one embodiment, a chassis may be disposed at the rear of the panel for supporting the panel. In one embodiment, at least one circuit board may be installed at the rear of the chassis and have at least one IC chip that emits heat mounted thereon. In one embodiment, the heat dissipating apparatus may dissipate heat from the IC chip to the outside.

In one embodiment, the heat dissipating apparatus may be attached to contact the IC chip and may include a heat conducting chip contact plate and heat discharging plate. In one embodiment, the heat discharging plate may be a heat conducting plate formed in one piece, having a plurality of mutually proximal joining portions joined to the chip contact plate, and a plurality of heat dissipating portions bent to protrude outward from the ends of the joining portions to connect the joining portions.

In one embodiment, the panel may be a plasma display panel using plasma discharging to form an image.

BRIEF DESCRIPTION OF THE DRAWINGS

Embodiments of the present invention will become more apparent by describing in detail exemplary embodiments thereof with reference to the attached drawings.

DETAILED DESCRIPTION OF CERTAIN INVENTIVE EMBODIMENTS

Embodiments of the present invention will now be described more fully with reference to the accompanying drawings, in which exemplary embodiments of the invention are shown.

Figure 3:
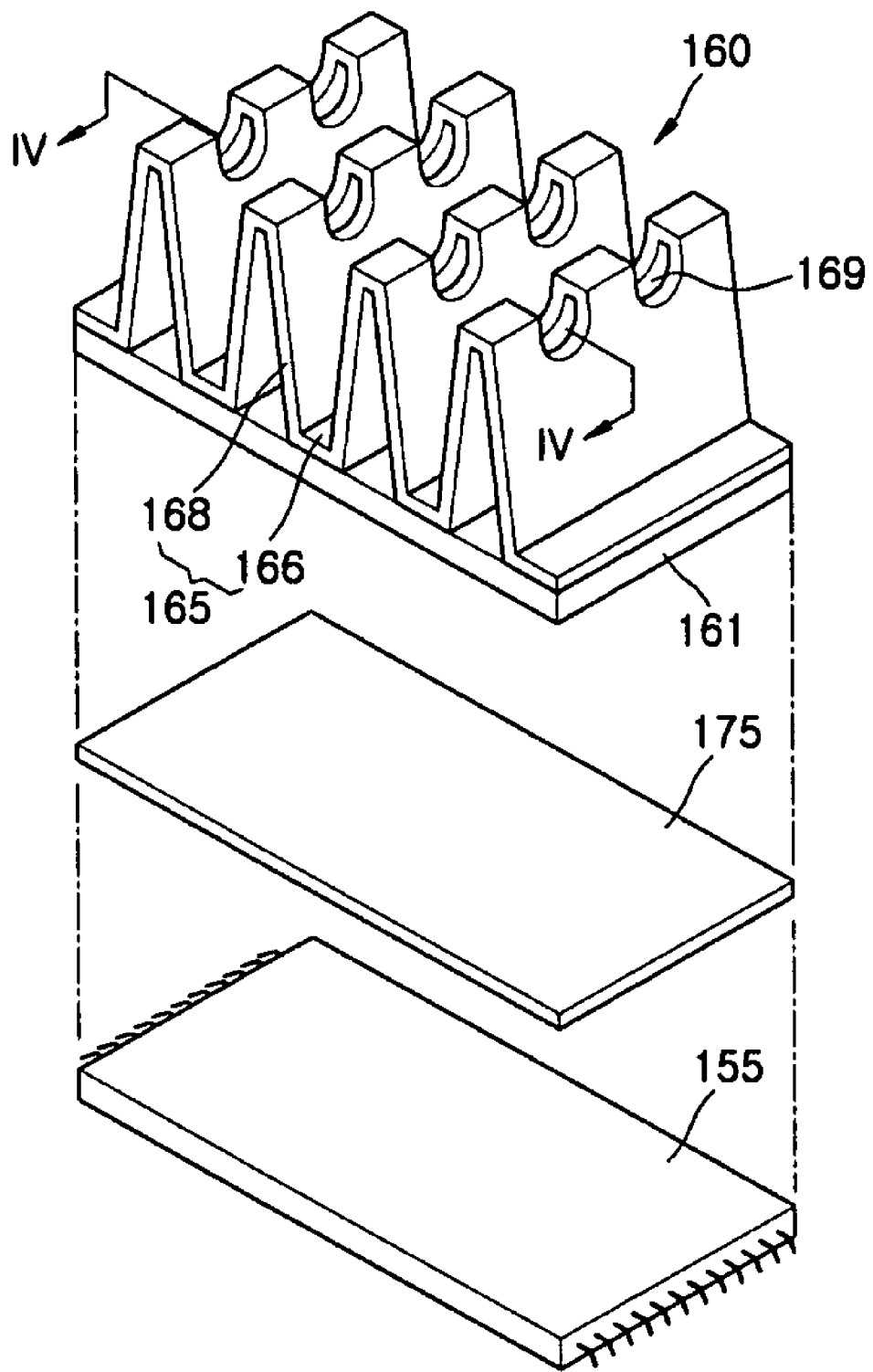
FIG. 3 is an exploded perspective view of a heat dissipating apparatus for an IC chip according to one embodiment of the present invention.
Figure 4:
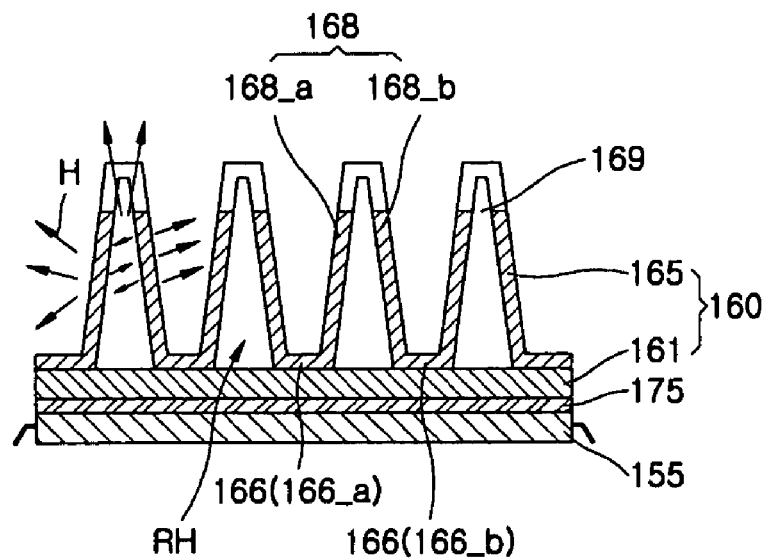
FIG. 4 is a sectional view of FIG. 3 taken along line IV-IV.

FIG. 3 is an exploded perspective view of a heat dissipating apparatus 160 for an IC chip according to one embodiment of the present invention, and FIG. 4 is a sectional view of FIG. 3 taken along line IV-IV. In one embodiment, the heat dissipating apparatus 160 effectively dissipates heat emitted from an IC chip 155 which drives a panel producing an image, and includes a chip contact plate 161 and a heat discharging plate 165.

The chip contact plate 161 is attached to contact the IC chip 155, and uses heat conduction to receive heat emitted by the IC chip 155. In one embodiment, the chip contact plate 161 is attached to the IC chip 155 by a conductive double-sided tape (not shown).

In one embodiment, the heat discharging plate 165 has a plurality of joining portions 166 and heat dissipating portions 168. In one embodiment, these joining and heat dissipating portions 166 and 168 are formed of a single heat conducting plate, in order to effectively dissipate heat received from the chip contact plate 161 to the outside. The joining portions 166 join to the chip contact plate 161, and the heat dissipating portions 168 are formed in one piece with the mutually proximal joining portions 166 to connect the spaces between the joining portions 166, and are bent to protrude outward from the joining portions 166. In one embodiment, as shown in FIGS. 3-6, the heat dissipating portions 168 are folded at the tops and the bottoms (joining portions 166) of the heat discharging plate 165. In this embodiment, the heat dissipating portions 168 may have a "saw tooth" or wave pattern as a whole.

In one embodiment, as shown in FIG. 4, a heat dissipating portion 168 connects the space between a first joining portion 166_a and an adjacent second joining portion 166_b. The heat dissipating portion 168 includes i) a first heat dissipating portion 168_a extending outward from the first joining portion 166_a and ii) a second heat dissipating portion 168_b. In one embodiment, as shown in FIGS. 3-4, the second heat dissipating portion 168_b is substantially symmetrical to the first heat dissipating portion 168_a with respect to an imaginary straight line passing through a folded top and a portion of the chip contact plate 161 which is located directly below the folded top. Furthermore, the second heat dissipating portion 168_b is connected to the first heat dissipating portion 168_a and extends outward from the second joining portion 166_b. Each of the first and second heat dissipating portions 168_a and 168_b performs the same function as the heat dissipating fin 65 (see FIG. 1) of the prior art heat sink 60 (see FIG. 1). Furthermore, each heat dissipating portion 168_a and 168_b substantially has the same surface area as one heat dissipating fin 65 (see FIG. 1). However, in the FIG. 4 embodiment, the generated heat can be dissipated not only from the exposed areas of the heat dissipating portions 168_a and 168_b but also from the area between the heat dissipating portions 168_a and 168_b as shown in FIG. 4. Thus, in the FIG. 4 embodiment, the emitted heat is dissipated from total eight dissipating portions (see arrows in FIG. 4) whereas in the prior art apparatus the heat is dissipated from four heat dissipating fins (see FIG. 1). Therefore, the actual surface area of the heat dissipating portion of the FIG. 4 embodiment is significantly greater than that of prior art heat sinks, thereby increasing their heat dissipating capacity in comparison to the prior art.

Figure 1:
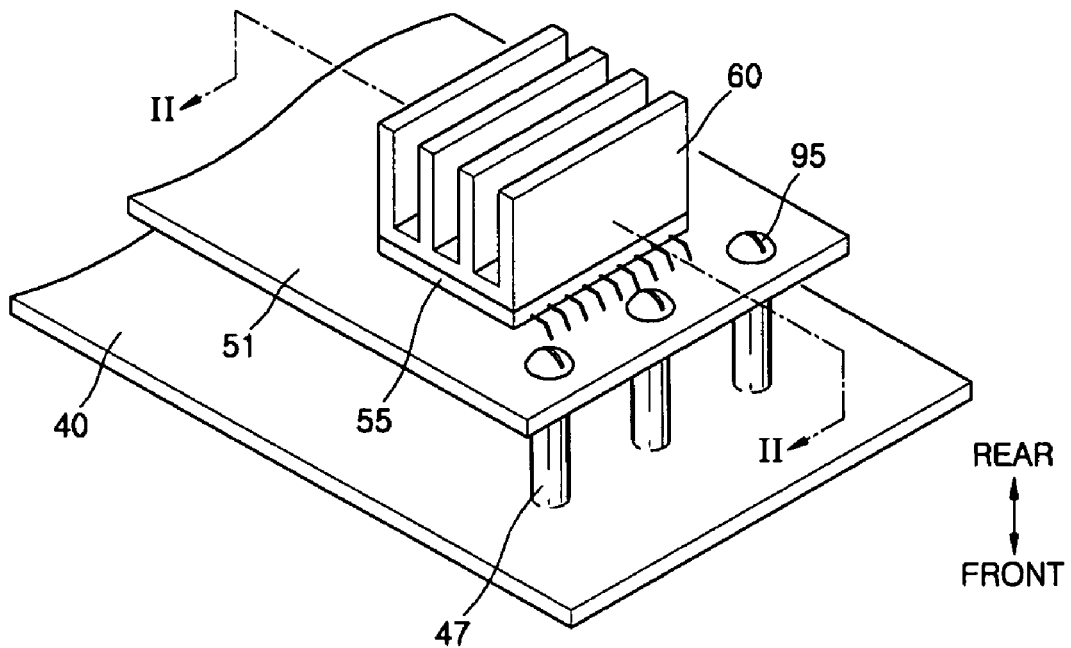
FIG. 1 is a perspective view of a portion of a prior art display module.
Figure 2:
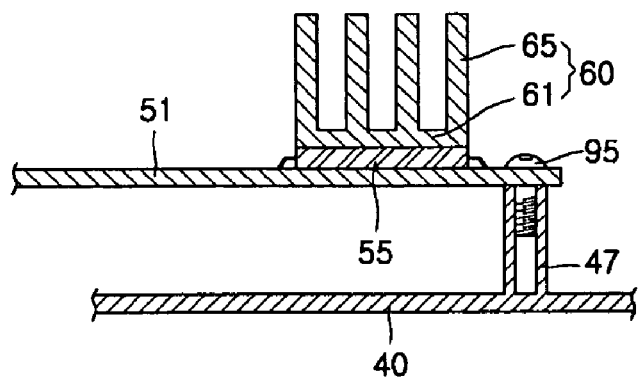
FIG. 2 is a sectional view of FIG. 1 taken along line II-II.
Figure 5:
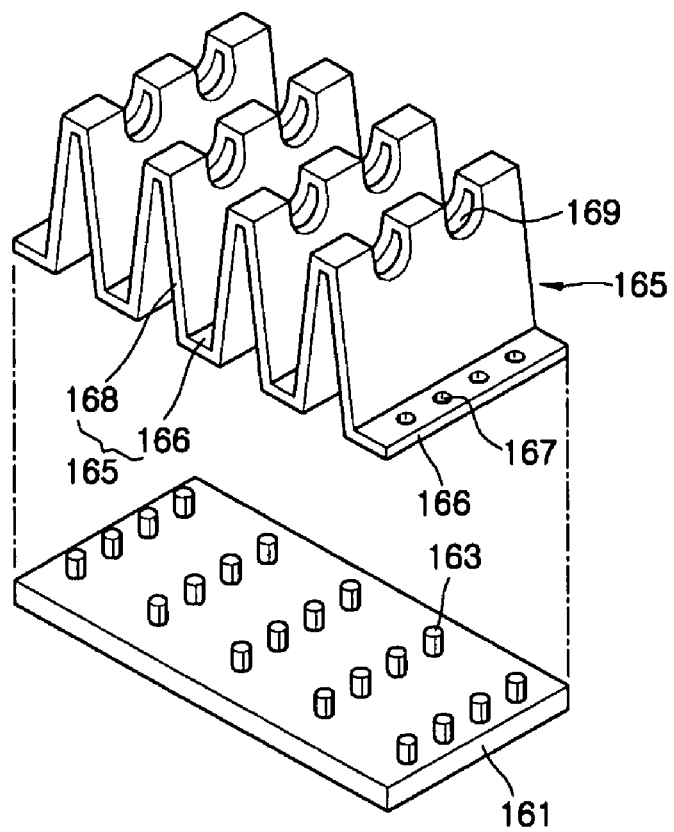
FIG. 5 is an exploded perspective view of a joining structure between the heat discharging plate and the chip contact plate of the IC chip heat dissipating apparatus of FIG. 3.

In another embodiment, a plurality of holes 169 are formed on the heat dissipating portions 168 (see FIG. 5). In this embodiment, heat discharging passages RH (see FIG. 4) are formed between the heat dissipating portions 168 and the chip contact plate 161, and the heat H discharged from the side of the heat dissipating portion facing the chip contact plate 161 is more effectively dissipated to the outside through the heat discharging passages RH. By forming the holes 169 on the heat dissipating portion 168, the heat H discharged from the side of the heat dissipating portion 168 facing the chip contact plate 161 is not only discharged to the outside through the heat discharging passages RH, but also through the holes 169 on the heat dissipating portion 168. The prior art heat sink of FIG. 1 did not provide heat discharging passages RH as shown in the FIG. 4 embodiment, since the heat dissipating fins 65 merely protruded from the base 61 as shown in FIGS. 1 and 2.

In one embodiment, the heat discharging plate 165 is made of a highly heat conductive material, such as copper or aluminium. In this case, the copper or aluminium heat discharging plate 165 can be manufactured using pressing processes, such as copper or aluminium sheet bending processes, drawing processes, or special sheet forming processes.

Prior art heat sinks are made of extruded aluminium materials. However, in one embodiment, the heat dissipating apparatus 160 can be made of the above pressing processes, resulting in a lighter weight and smaller size.

In one embodiment, the chip contact plate 161 is formed at least in a predetermined width in order to receive the large amount of heat from the IC chip 155. In this embodiment, the heat discharging plate 165 is formed to have a width narrower than that of the chip contact plate 161, in order to effectively dissipate heat it receives from the chip contact plate 161 to the outside.

In this case, the chip contact plate 161 can also be made from the same material, i.e., copper or aluminium, as the heat discharging plate 165.

In one embodiment, a heat conducting medium 175 can be interposed between the IC chip 155 and the chip contact plate 161. In one embodiment, this heat conducting medium 175 may have a high heat conductivity, to effectively transfer the heat created by the IC chip 155 to the chip contact plate 161, and also elasticity. The heat conducting medium 175 can be a thermal sheet or thermal grease.

In one embodiment, the joining portions 166 of the heat discharging plate 165 attach to the chip contact plate 161. In one embodiment, the joining portions 166 can be joined to the chip contact plate 161 with a boss caulking, as shown in FIG. 5. For example, a plurality of bosses 163 are formed on the chip contact plate 161, and boss holes 167 can be formed at the locations corresponding to the bosses 163 on the joining portions 166. After the bosses 163 on the chip contact plate 161 fit through the boss holes 167 on the joining portions 166, caulking is used to firmly hold the chip contact plate 161 and the heat discharging plate 165 together.

Figure 6:
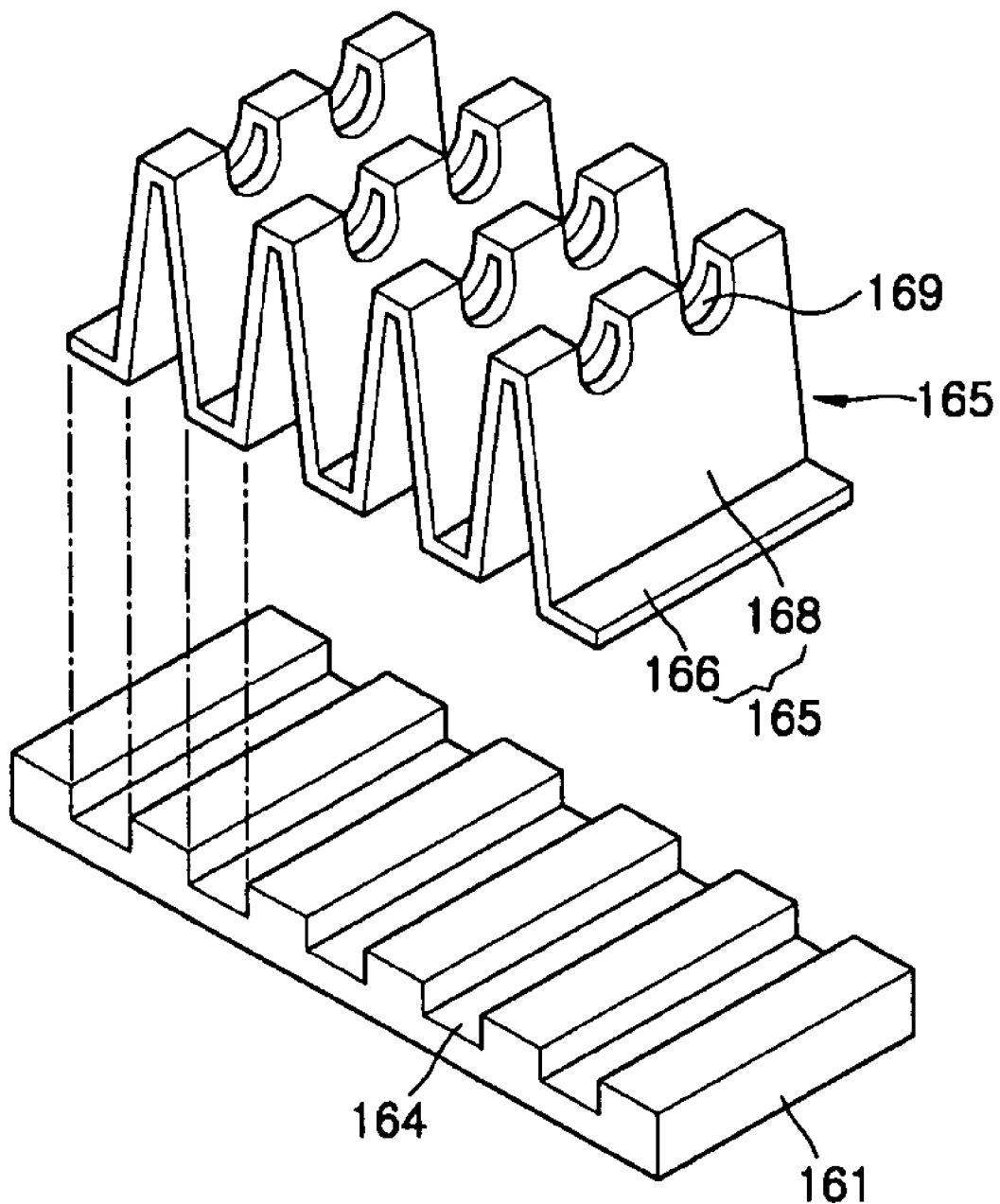
FIG. 6 is an exploded perspective view of a variation of the structure of FIG. 5.

In another embodiment, the heat discharging plate 165 and the chip contact plate 161 can be coupled by fin swaging, as shown in FIG. 6. That is, a plurality of fin grooves 164 can be formed at evenly-spaced intervals on the chip contact plate 161, so that the joining portions 166 of the heat discharging plate 165 can be pressed and snapped into the respective fin grooves 164, in order to firmly couple the chip contact plate 161 and the heat discharging plate 165. In still another embodiment, other common coupling processes such as soldering and bonding can also be used.

In one embodiment, the IC chip 155 contacting the chip contact plate 161 can be an IPM. Such an IPM is an all-in-one, highly integrated circuit module including a switching element, element driving circuit, and basic protective circuit, which can function by itself in accordance with an inputted signal, when a power supply and an electrical signal are provided thereto. Consequently, due to the effects of the integrated circuit on an IPM, the latter radiates more heat than an ordinary IC chip.

Figure 7:
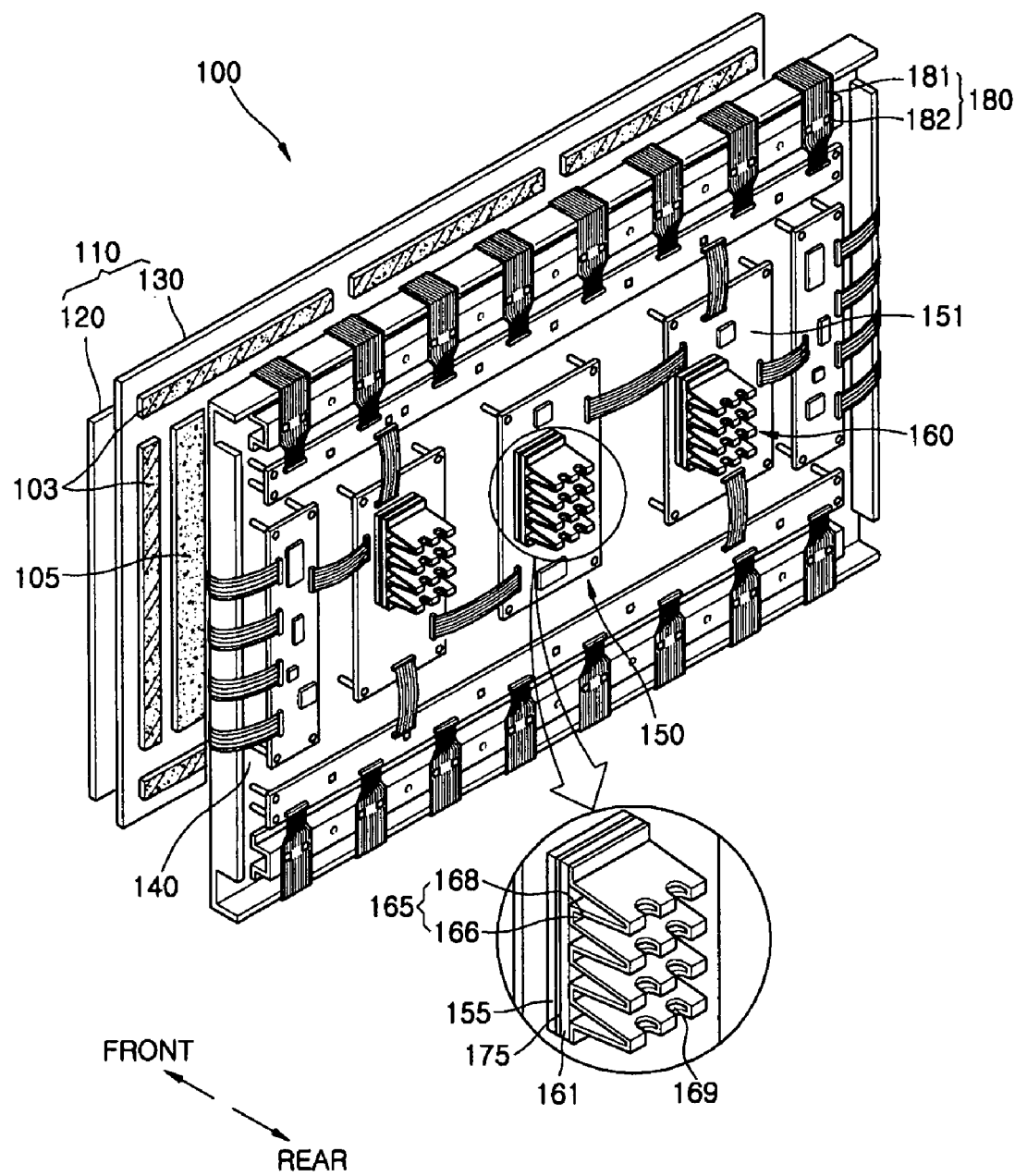
FIG. 7 is an exploded perspective view showing a display module, according to one embodiment of the present invention.

A display module 100 having a heat dissipating apparatus 160 according to an embodiment of the present invention, includes a panel 110, chassis 140, and a circuit part 150, in addition to the IC chip heat dissipating apparatus 160, as shown in FIG. 7.

The panel 110 has two substrates oppositely disposed, through which an image is produced. Many types of display panels can be used for the panel 110, including a plasma display panel that uses plasma discharging, and which has a front panel 120 and a rear panel 130. In this case, although not shown in FIG. 7, barrier ribs, sustain electrode pairs, address electrodes, and phosphor layers can be formed between the front panel 120 and the rear panel 130.

Such a panel 110, which produces an image, can be coupled to a chassis 140. The chassis 140 supports the panel 110. In this instance, the panel 110 and the chassis 140 are coupled with an adhesive 103, for example, a double-sided tape. Furthermore, a heat transferring medium 105 can be disposed between the panel 110 and the chassis 140 for transferring heat generated by the panel 110 to the chassis 140.

Behind the chassis 140 is installed a circuit portion 150 with at least one circuit board 151, including a logic board, power board, or logic buffer board, for driving the panel 110. At least one IC chip 155 is mounted on the circuit board 151.

The circuit portion 150 can transmit an electrical signal to the panel 110 through a signal transmitter 180. The signal transmitter 180 can be a flexible circuit board, such as a tape carrier package (TCP) or a chip on film (COF), in which case, the signal transmitter 180 can be a package having at least one mounting device 182 mounted on a respective wire portion 181 in tape form.

In one embodiment, the heat dissipating apparatus 160 is attached to the IC chip 155. The heat dissipating apparatus 160 includes a chip contact plate 161 and a heat discharging plate 165, whose structure is the same as the previously explained structure; and thus an explanation is omitted.

In one embodiment, the chip contact plate 161 is disposed to contact the rear of the IC chip 155, and the heat dissipating portions 168 of the heat discharging plate 165 are bent and protrude rearward from the ends of the joining portions 166.

The above structure, according to one embodiment of the present invention, has a larger surface area for dissipating heat generated by an IC chip to the outside than prior art heat sinks, and can therefore effectively dissipate heat emitted by an IC chip to the outside, without using separate cooling components.

Moreover, a heat dissipating apparatus for an IC chip can be press-formed so that it is lighter and smaller, reducing manufacturing costs.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A heat dissipating apparatus for a flat display panel device, the heat dissipating apparatus comprising:

a chip contact plate formed at a surface of an IC chip and having heat conductivity, wherein the IC chip is configured to generate heat while driving a flat display panel, wherein the surface faces away from a chassis base which supports the flat display panel, and wherein a plurality of grooves are formed on the chip contact plate; and a heat discharging plate including a plurality of heat dissipating portions formed on the chip contact plate, wherein each of the heat dissipating portions includes i) a top which does not contact the chip contact plate and ii) two spaced sides, wherein each side comprises first and second ends opposing each other, wherein the first ends of each side extends from the top, wherein the second ends of each side contact the chip contact plate, wherein the top and the sides of each heat dissipating portion are configured to form a tapered heat dissipating portion, wherein each of the heat dissipating portions defines, in conjunction with a portion of the chip contact plate, a partially covered air passage, and wherein the heat discharging plate is configured to dissipate the generated heat at least via the partially covered air passage, wherein the heat discharging plate comprises a plurality of joining portions which contact the chip contact plate, wherein at least one of the plurality of joining portions interconnects adjacent heat dissipating portions, and wherein the plurality of grooves of the chip contact plate are configured such that the plurality of joining portions are pressed and snapped into the respective grooves in order to firmly couple the chip contact plate and the heat discharging plate, wherein at least one hole is defined on the top of each heat dissipating portion so that the heat discharging plate is further configured to dissipate the generated heat via the hole, and wherein the apparatus further comprises a heat conducting medium formed between the IC chip and the chip contact plate.

2. The heat dissipating apparatus of claim 1, wherein the heat discharging plate is formed of a copper or aluminum material.

3. The heat dissipating apparatus of claim 2, wherein the heat discharging plate is manufactured by press forming.

4. The heat dissipating apparatus of claim 1, wherein the chip contact plate is formed of a copper or aluminum material.

5. The heat dissipating apparatus of claim 1, wherein the heat discharging plate is formed of a single heat-conductive plate.

6. The heat dissipating apparatus of claim 1, wherein the IC chip is an intelligent power module (IPM).

7. A display module for use with a flat display panel device, the module comprising:
   a flat panel configured to produce an image;
   a chassis configured to support the panel;
   at least one circuit board connected to the chassis, and including at least one IC chip that is configured to generate heat while driving the flat panel, wherein the at least one IC chip comprises a surface which faces away from the chassis; and
   a heat dissipating apparatus including i) a chip contact plate formed at the surface of the at least one IC chip, wherein a plurality of grooves are formed on the chip contact plate and ii) a heat discharging plate, wherein the heat discharging plate includes a plurality of heat dissipating portions formed on the chip contact plate, wherein each of the heat dissipating portions includes i) a top which does not contact the chip contact plate and ii) two spaced sides, wherein each side comprises first and second ends opposing each other, wherein the first ends of each side extends from the top, wherein the second ends of each side contact the chip contact plate, wherein the top and the sides of each heat dissipating portion are configured to form a tapered heat dissipating portion, wherein each of the heat dissipating portions defines, in conjunction with a portion of the chip contact plate, a partially covered air passage, and wherein the heat discharging plate is configured to dissipate the generated heat at least via the partially covered air passage,
   wherein the heat discharging plate comprises a plurality of joining portions which contact the chip contact plate, wherein at least one of the plurality of joining portions interconnects adjacent heat dissipating portions, and wherein the plurality of grooves of the chip contact plate are configured such that the plurality of joining portions are pressed and snapped into the respective grooves in order to firmly couple the chip contact plate and the heat discharging plate, wherein at least one hole is defined on the top of each heat dissipating portion so that the heat discharging plate is further configured to dissipate the generated heat via the hole, and wherein the apparatus further comprises a heat conducting medium formed between the IC chip and the chip contact plate.

8. The display module of claim 7, wherein the top of each heat dissipating portion is folded.

9. The display module of claim 7, wherein the heat discharging plate and the chip contact plate are formed of a copper or aluminum material.

10. The display module of claim 9, wherein the heat discharging plate is manufactured by press forming.

11. The display module of claim 7, wherein the heat discharging plate is formed of a single heat-conductive plate.

12. The display module of claim 7, wherein the heat discharging plate is thinner than the chip contact plate.

13. The display module of claim 7, wherein the flat panel is a plasma display panel.

14. The heat dissipating apparatus of claim 1, wherein a cross section of the heat discharging plate has a saw-tooth or wave pattern.

15. The display module of claim 7, wherein a cross section of the heat discharging plate has a saw-tooth or wave pattern.

16. A heat dissipating apparatus for use with a flat display panel device, the heat dissipating apparatus comprising:
   a chip contact plate formed at a surface of an IC chip, wherein the IC chip is configured to generate heat while driving a flat display panel, wherein the surface faces away from a chassis base which supports the flat display panel, and wherein a plurality of grooves are formed on the chip contact plate; and
   a plurality of heat dissipating portions configured to dissipate heat generated in the IC chip, wherein each of the heat dissipating portions includes a folded top and two spaced sides, wherein the folded top and the sides of each heat dissipating portion are configured to form a tapered heat dissipating portion, and wherein an air passage is defined between the folded top and two sides;
   wherein the plurality of heat dissipating portions comprise a plurality of joining portions which contact the chip contact plate, wherein at least one of the plurality of joining portions interconnects adjacent heat dissipating portions, and wherein the plurality of grooves of the chip contact plate are configured such that the plurality of joining portions are pressed and snapped into the respective grooves in order to firmly couple the chip contact plate and the heat dissipating portions, wherein at least one hole is defined on the top of each heat dissipating portion so that the heat discharging plate are further configured to dissipate the generated heat via the hole, and wherein the apparatus further comprises a heat conducting medium formed between the IC chip and the chip contact plate.

17. A heat dissipating apparatus for use with a flat display panel device, the heat dissipating apparatus comprising:
   a chip contact plate formed at a surface of an IC chip, wherein the IC chip is configured to generate heat while driving a flat display panel, wherein the surface faces away from a chassis base which supports the flat display panel, and wherein a plurality of grooves are formed on the chip contact plate; and
   a plurality of tapered wave portions that contact the chip contact plate and connect to form a continuous wave structure,
   wherein the plurality of tapered wave portions comprise a plurality of joining portions which contact the chip contact plate, wherein at least one of the plurality of joining portions interconnects adjacent tapered wave portions, and wherein the plurality of grooves of the chip contact plate are configured such that the plurality of joining portions are pressed and snapped into the respective grooves in order to firmly couple the chip contact plate and the tapered wave portions, wherein at least one hole is defined on the top of each heat dissipating portion so that the heat discharging plate is further configured to dissipate the generated heat via the hole, and wherein the apparatus further comprises a heat conducting medium formed between the IC chip and the chip contact plate.

* * * * *